(12) United States Patent
Ueno

(10) Patent No.: US 7,240,431 B2
(45) Date of Patent: Jul. 10, 2007

(54) METHOD FOR PRODUCING MULTILAYER PRINTED WIRING BOARD, MULTILAYER PRINTED WIRING BOARD, AND ELECTRONIC DEVICE

(75) Inventor: Yukihiro Ueno, Hiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/258,068

(22) Filed: Oct. 26, 2005

(65) Prior Publication Data

US 2006/0086535 A1 Apr. 27, 2006

(30) Foreign Application Priority Data

Oct. 27, 2004 (JP) ............... 2004-312520

(51) Int. Cl.
*H01K 3/10* (2006.01)
(52) U.S. Cl. ............... 29/852; 29/830; 427/97.1; 427/97.2; 427/97.7
(58) Field of Classification Search ............... 29/830, 29/852; 427/97.1, 97.2, 97.7, 97.9
See application file for complete search history.

(56) References Cited

U.S. PATENT DOCUMENTS

| | | | | |
|---|---|---|---|---|
| 3,959,523 A | * | 5/1976 | Grunwald et al. | 427/97.3 |
| 4,303,798 A | * | 12/1981 | Paunovic | 174/257 |
| 5,288,377 A | * | 2/1994 | Johnson et al. | 204/486 |
| 5,301,420 A | * | 4/1994 | Cho et al. | 29/840 |
| 5,545,308 A | * | 8/1996 | Murphy et al. | 205/125 |
| 6,023,842 A | * | 2/2000 | Larson | 29/852 |
| 6,044,550 A | * | 4/2000 | Larson | 29/852 |

FOREIGN PATENT DOCUMENTS

| | | |
|---|---|---|
| JP | 60-43893 A | 3/1985 |
| JP | 2-158188 A | 6/1990 |
| JP | 2000-294924 A | 10/2000 |
| JP | 2004-146668 A | 5/2004 |

* cited by examiner

*Primary Examiner*—Carl J. Arbes
(74) *Attorney, Agent, or Firm*—Birch, Stewart, Kolasch & Birch, LLP

(57) ABSTRACT

A plating resist film 2 is formed on a wiring board substrate 1 as a core material of a multilayer printed wiring board, then a through-hole 3 is formed, and through-hole conductor 4 is formed along the wall surface of the through-hole 3 and the through-hole surface of the plating resist film 2, so that protrusion portion 4a is formed in the through-hole conductor 4. The plating resist film 2 is then stripped off and a panel plating layer 5 is formed on the surface of the wiring board substrate 1 and the through-hole conductor 4 so that the through-hole 4 and the panel plating layer 5 are connected with the protrusion 4a coated, and thus the connection area can be increased.

9 Claims, 7 Drawing Sheets

METHOD FOR PRODUCING MULTILAYER PRINTED WIRING BOARD, MULTILAYER PRINTED WIRING BOARD, AND ELECTRONIC DEVICE

BACKGROUND OF THE INVENTION

This application claims priority under 35 U.S.C. § 119 (a) on Patent Application No. 2004-312520 filed in Japan on Oct. 27, 2004, the entire contents of which are hereby incorporated by reference.

The present invention relates to a method for producing a multilayer printed wiring board that improves the reliability of through-hole conductor formed on a multilayer printed wiring board, a multilayer printed wiring board, and an electronic device using such a multilayer printed wiring board.

FIGS. 13 and 14 are cross-sectional views in a process for explaining a multilayer printed wiring board of Conventional example 1 and a method for producing the same.

FIG. 13 shows a base material of a multilayer printed wiring board of Conventional example 1. For the base material of the multilayer printed wiring board, a commercially available laminate having copper coating on both its sides, more specifically a laminate having a copper foil as a metal foil 102 laminated on each side of a resin plate 101 serving as a core material, is used. A through-hole 103 (see FIG. 14) is formed on the base material with a drill or the like, followed by application of an appropriate plating pretreatment.

FIG. 14 shows a state in which the laminate having copper coating on both its sides for a multilayer printed wiring board whose entire surface has been subjected to panel plating after the plating pretreatment performed in FIG. 13. The panel plating is a plating process to form a metal layer (a panel plating layer 104 and a panel-plated through-hole conductor 104a) on the entire surface of the multilayer printed wiring board (laminate having copper coating on both its sides) through electroless plating or electrolytic plating. The metal plating is usually performed using the same metal as the metal foil 102.

Subsequent to application of the panel plating, the multilayer printed wiring board is formed by forming an etching resist on the surface of the panel plating layer 104 and patterning the panel plating layer 104 and the metal foil 102 so that a conductor pattern that corresponds to specific circuit wiring is formed.

In addition to Conventional example 1 described above, Conventional examples 2 and 3 as follows have also been known.

As Conventional example 2, a method is proposed in which a desired pattern (conductor pattern) including a land portion for forming wiring around a through-hole portion is formed on the surface of a copper-coated laminate substrate, and then a resist is formed on the portions other than the through-hole portion and the land portion before a hole is opened so as to form the through-hole portion (for example, JP S60-43893A (hereinafter referred to as Patent document 1) and Japanese Patent No. 3048360 (hereinafter referred to as Patent document 2). This method requires an additional plating process since a through-hole conductor is formed by separately performing a plating process exclusively to the through-hole portion. In addition, as the land portion becomes smaller, positioning becomes more difficult.

As Conventional example 3, a method is proposed in which a through-hole conductor is formed by forming a desirable circuit conductor (conductor pattern) on the surface of an insulating substrate, then forming a protective film on the entire surface, forming a hole (through-hole), and removing the protective film from around the through-hole (for example, see JP H8-34340B). This method also entails the same problems as Patent documents 1 and 2.

As the size reduction and sophistication level of electronic devices advance, a demand for increased wiring density on a wiring board has become stronger. Responding to such a demand, the number of conductor layers on a wiring board shows an increase in trend. Meanwhile, there has also been a strong demand for cost reduction for wiring boards, and a demand for reduced number of conductor layers to reduce wiring board cost has also been strong. With these backgrounds, the line width of wiring patterns (conductor patterns) has kept decreasing in order to achieve a higher wiring density. This tendency is especially significant in a conductor pattern on the outer-most layer of wiring boards.

When forming a conductor pattern using a conventional etching method, it is difficult to achieve a fine conductor pattern beyond a certain point due to an issue of aspect ratio between the line width and film thickness of a conductor pattern. For example, as mentioned in Conventional example 1, the film thickness of a conductor in a layer for forming a conductor pattern (metal foil and panel plating layer) is a sum of the film thickness of a metal foil layered on a multilayer printed wiring board as the base material and the film thickness of a panel plating layer formed through panel plating, which results in 50 μm or more in normal constructions.

In addition, when forming a conductor pattern through etching, it is difficult to change the etching speed ratio between the depth direction and plane direction of the conductor pattern. The ratio between the minimum line spacing (width between conductor patterns) and film thickness of a conductor (film thickness of a conductor pattern) that can be produced by patterning is close to 1:1.

In general, the line width of a conductor pattern and the conductor pattern spacing are designed so that the ratio is close to 1:1. For this reason, it has not been easy to form a conductor pattern with a line width smaller than the film thickness of the conductor pattern.

Consequently, when a finer conductor pattern with a smaller line width is desired, a generally selected method is to reduce the film thickness of a panel plating layer or the film thickness of a metal foil, which is layered on the multilayer printed wiring board as the base material.

The film thickness of a panel plating layer is equal to the film thickness of a through-hole conductor. However, the film thickness of a through-hole conductor can become smaller than the film thickness of a panel plating layer depending on conditions such as the state of the wall surface of the through-hole and the flow of plating fluid, and often varies due to unstable deposition of a plating metal. Accordingly, the film thickness of a panel plating layer cannot be reduced too much, in view of the heat stress to be applied during the use of the multilayer printed wiring board and at the time of mounting electronic components, reliability in a long-term use, an increase in the conductive resistance of through-hole conductor and others, and therefore a conductor pattern with a small line width cannot be formed.

In addition, although it is possible to reduce the film thickness of the metal foil to some extent, there are problems in that the production cost increases to form thin metal foils, and in that handling of the metal foils is more difficult because of their small thickness, for example, a surface treatment prior to formation of a panel plating layer (pretreatment for plating) is performed with difficulty.

Furthermore, when the film thickness of the panel plating layer is reduced relative to the film thickness of the metal foil, the film thickness of the through-hole conductor (panel plating layer) can become particularly thin around the opening of the through-hole (shoulder area of the land portion of the through-hole conductor which achieves conductivity between the through-hole conductor and the metal foil), which could result in susceptibility to thermal shock. In other words, relative reduction in the film thickness of the panel plating layer causes such problems as deteriorated reliability of the through-hole conductor and increased conductive resistance of the through-hole conductor.

SUMMARY OF THE INVENTION

The present invention is carried out in view of the above-described problems, and has an object of providing a multilayer printed wiring board having a more reliable through-hole conductor and achieving a conductor pattern having a small line width (high-density conductor pattern) by reducing the thickness of the panel plating layer, by increasing the substantial film thickness of the through-hole conductor and increasing the connection area between the through-hole conductor and the panel plating layer, and a method for producing the same.

In addition, the present invention has another object of providing a highly reliable electronic device by mounting electronic components on such a multilayer printed wiring board.

A method for producing a multilayer printed wiring board according to the present invention is a method for producing a multilayer printed wiring board having a through-hole that penetrates a wiring board substrate, comprising a plating resist film forming step of forming a plating resist film on a surface of the wiring board substrate, a through-hole forming step of forming the through-hole that penetrates the plating resist film and the wiring board substrate, a plating pretreatment step of performing a pretreatment for plating on a through-hole surface of the plating resist film and a wall surface of the through-hole, a through-hole conductor forming step of forming a through-hole conductor on the through-hole surface of the plating resist film and the wall surface of the through-hole by a plating treatment, and a plating resist film stripping step of stripping off the plating resist film.

This configuration, in which a protrusion portion of a through-hole conductor is formed by forming the through-hole conductor to extend along the wall surface of a through-hole so that the through-hole conductor has a larger area around the opening area of the through-hole, makes it possible to enlarge the connection area between the through-hole conductor and a panel plating layer (conductor pattern) that is formed on the wiring board substrate. Accordingly, the conductive resistance can be reduced by improving the electrical and physical connection strength of the through-hole conductor to the panel plating layer, and thereby the reliability of the through-hole conductor, in other words, the reliability of the multilayer printed wiring board, can be improved.

In the method for producing a multilayer printed wiring board according to the present invention, the plating pretreatment step may include a polishing step of polishing the surface of the plating resist film after the plating resist film and the through-hole are subjected to the plating pretreatment.

This configuration, in which a plating catalyst that has been applied in the plating pretreatment step is left only on the wall surface of the through-hole and the through-hole surface of the plating resist film, makes it possible to reliably form the protrusion portion of the through-hole conductor with high precision.

The method for producing a multilayer printed wiring board according to the present invention may use a resin plate as the wiring board substrate. The resin plate may further be a fiber-reinforced resin plate, resin plate containing adhesive, or resin plate processed with a plating catalyst. The wiring board substrate may yet further be a two-sided metal coated laminate having a metal foil attached to both its sides. The wiring board substrate may yet further be an internal layer-containing laminate including an internal conductor layer.

This configuration, in which a resin plate and various types of processed resin plates that are generally utilized are used, makes it possible to achieve versatility and to produce a moderately-priced multilayer printed wiring board.

The method for producing a multilayer printed wiring board according to the present invention may include a panel plating layer forming step of forming a panel plating layer for coating the surface of the through-hole conductor and the wiring board substrate on the wiring board substrate by a plating treatment after the plating resist stripping step.

This configuration, in which the surface of the through-hole conductor having the protrusion portion and the wiring board substrate are reliably coated with a panel plating layer in a specific film thickness suitable for microsizing, makes it possible to secure a reliable connection between the through-hole conductor and the panel plating layer using the protrusion portion of the through-hole conductor. Furthermore, the substantial film thickness of the through-hole conductor can be increased through the panel plating layer, and therefore the reliability of the through-hole conductor can be improved by reducing the conductive resistance of and improving the physical strength of the through-hole conductor. Accordingly, it is possible to improve the reliability of the through-hole conductor even on a high-density multilayer printed wiring board that has a thin panel plating layer formed thereon for the purpose of forming a fine conductor pattern with a small line width. Furthermore, since plating deficiencies generated during formation of the through-hole conductor can be compensated with plating on the panel-plated through-hole conductor, the percent defective of the through-hole conductor can be further reduced.

The method for producing a multilayer printed wiring board according to the present invention may include a protrusion portion pressing step of pressing a protrusion portion of the through-hole conductor against the wiring board substrate after the plating resist stripping step but prior to the panel plating layer forming step.

This configuration, in which the through-hole conductor is reliably pressed against (in contact with) the wiring board substrate, makes it possible to improve the reliability of the through-hole conductor by further improving the physical strength of the through-hole conductor.

In the method for producing a multilayer printed wiring board according to the present invention, the thickness of the conductor in the area where the protrusion portion is coated with the panel plating layer may be larger than the thickness of the panel plating layer on the surface of the wiring board substrate.

This configuration, in which the protrusion portion of the through-hole conductor is reliably coated with the panel plating layer at the connection point between the protrusion portion of the through-hole conductor and the panel plating layer, makes it possible to reduce the conductive resistance of the through-hole conductor and to improve the contact strength by securing the connection area of the through-hole conductor and the panel plating layer. In other words, it is possible to secure the reliability of the through-hole conductor as well as to facilitate formation of the conductor pattern.

The method for producing a multilayer printed wiring board according to the present invention may include a patterning step of pattering the panel plating layer so as to form a conductor pattern after the panel plating layer forming step.

This configuration, in which the conductor pattern is formed by patterning the panel plating layer formed in a specific film thickness suitable for microsizing, makes it possible to form a fine conductor pattern, and thereby makes it possible to form a high-density conductor pattern with high patterning precision.

A multilayer printed wiring board according to the present invention is a multilayer printed wiring board including a wiring board substrate and a through-hole that penetrates the wiring board substrate, which includes a through-hole conductor that is formed on a surface of the through-hole and has a protrusion portion that projects from a surface of the wiring board substrate, and a panel plating layer that coats the surface of the wiring board substrate and the through-hole conductor.

This configuration, in which the electrical and physical contact strength of the through-hole conductor to the wiring board substrate can be increased by enlarging the connection area between the through-hole conductor and the panel plating layer, makes it possible to reduce the conductive resistance of and improve the physical strength of the through-hole conductor with respect to the wiring board substrate and to achieve a highly reliable multilayer printed wiring board that has a highly reliable through-hole conductor.

The multilayer printed wiring board according to the present invention may use a resin plate as the wiring board substrate. The resin plate may further be a fiber-reinforced resin plate, resin plate containing adhesive, or resin plate processed with a plating catalyst. The wiring board substrate may yet further be a two-sided metal coated laminate having a metal foil attached to both its sides. The wiring board substrate may yet further be an internal layer-containing laminate including an internal conductor layer.

This configuration, in which a resin plate and various types of processed resin plates that are generally utilized are used, makes it possible to achieve versatility and to produce a moderately-priced multilayer printed wiring board.

In the multilayer printed wiring board according to the present invention, the panel plating layer may be patterned so that a conductor pattern is formed.

This configuration makes it possible to achieve a multilayer printed wiring board that has a high-density conductor pattern with high patterning precision and has a highly reliable through-hole conductor.

In the multilayer printed wiring board according to the present invention, the protrusion portion may be pressed against the wiring board substrate.

This configuration, in which the through-hole conductor is reliably pressed against (in contact with) the wiring board substrate, makes it possible to achieve a highly reliable multilayer printed wiring board that has a through-hole conductor having further higher physical strength.

In the multilayer printed wiring board according to the present invention, the thickness of the conductor in the area where the protrusion portion is coated with the panel plating layer may be larger than the thickness of the conductor pattern.

This configuration, in which the protrusion portion is reliably coated with the panel plating layer at the connection point between the through-hole conductor and the panel plating layer, makes it possible to achieve a highly reliable multilayer printed wiring board that has a through-hole conductor having low conductive resistance and has a high contact strength between the through-hole conductor and the panel plating layer. Since the panel plating layer can be set in a specific film thickness suitable for microsizing, it is possible to achieve a multilayer printed wiring board that has a high-density conductor pattern with high patterning precision.

An electronic device according to the present invention includes an electronic component mounted on the conductor pattern of a multilayer printed wiring board according to the present invention.

This configuration makes it possible to achieve a highly reliable electronic device that has a multilayer printed wiring board having a highly reliable through-hole conductor.

DESCRIPTION OF THE PREFERRED EMBODIMENTS

Hereinafter, embodiments of the present invention will be described with reference to the accompanying drawings.

Embodiment 1

FIGS. 1 to 5 are cross-sectional views in process for explaining a multilayer printed wiring board and a method for producing the same according to Embodiment 1 of the present invention.

Figure 1:
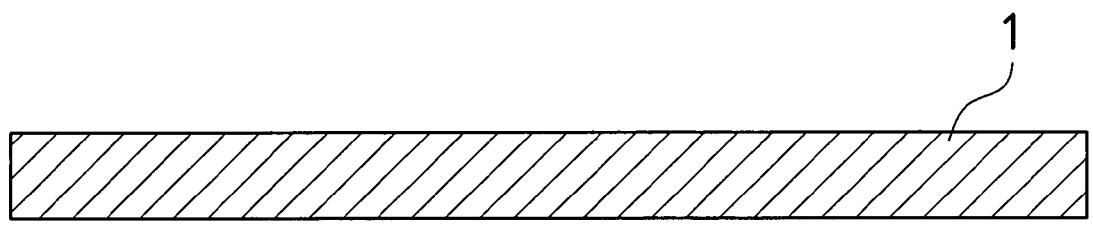
FIG. 1 is a cross-sectional view in a process for explaining a multilayer printed wiring board and a method for producing the same according to Embodiment 1 of the present invention, and shows a wiring board substrate, which is a core material of the multilayer printed wiring board.

FIG. 1 shows a wiring board substrate 1, which is a core material of a multilayer printed wiring board according to the present invention. The wiring board substrate 1 is constituted by an insulating resin plate that is generally available in the market. Although a material such as epoxy resin, polyester resin, fluororesin and polyimide resin is generally used for the resin plate, it is needless to say that other materials may be used. In addition, to secure the physical strength, a fiber-reinforced resin plate, which is reinforced with fibers such as paper, fiber glass and aramid fiber, is preferable as the resin plate.

Furthermore, in view of simplification of production process, a resin plate processed with a plating catalyst, which has a plating catalyst mixed into the resin as appropriate, is further preferable to facilitate a plating treatment to be performed in a subsequent process. In addition, a resin plate containing adhesive, which has adhesive mixed in, is yet further preferable in order to improve the adhesion performance of a panel plating layer that is formed through a plating treatment (see the panel plating layer 5 in FIG. 4) to the wiring board substrate 1.

Figure 2:
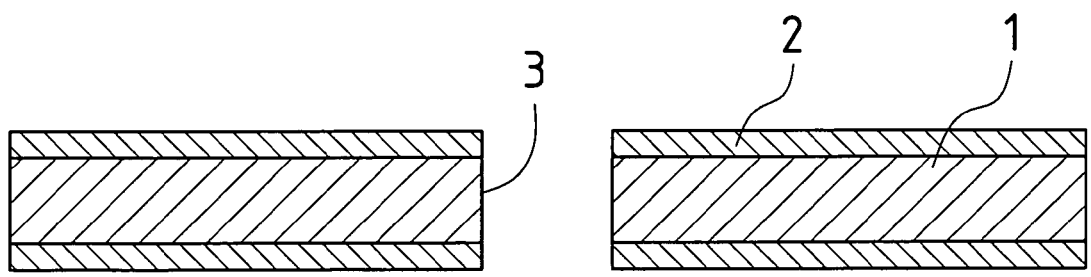
FIG. 2 is a cross-sectional view in a process for explaining a multilayer printed wiring board and a method for producing the same according to Embodiment 1 of the present invention, showing a state in which a through-hole that penetrates the wiring board substrate and a plating resist film is formed.

FIG. 2 shows a state in which a plating resist film 2 is formed on the wiring board substrate 1 through application or the like in a plating resist film forming process, and then in a through-hole formation process, a through-hole 3 is formed in the wiring board substrate 1 and the plating resist film 2. In other words, it shows a state in which the through-hole 3 that penetrates the plating resist film 2 and the wiring board substrate 1 is formed.

Since the thickness of the plating resist film 2 has a correlation with the protrusion length La (see FIG. 4) of a protrusion 4a (see FIG. 3) of a through-hole conductor 4 (see FIG. 3) that projects from the surface of the wiring board substrate 1, the thickness of the plating resist film 2 is determined as appropriate based on the planned protrusion length La. In other words, the thickness of the plating resist film 2 is set in the same level as the protrusion length La. In this embodiment, the plating resist film 2 was formed in a thickness in a range of 20 to 30 µm.

For the plating resist film 2, a resin material that allows attachment of a plating catalyst so as to be plated to some extent, that has a limited adhesion to the wiring board substrate 1 and the through-hole conductor 4 that is formed through a plating treatment, and that can be removed easily with appropriate solvent or the like is suitable. For this embodiment, a material prepared by blending in a small amount (1 to 5%) of fluororesin (such as ethylene tetrafluoride) to a base comprising a resin (e.g., acrylic resin) that is usually used as an etching resist in etching metal materials such as copper was used.

Then, as a plating pretreatment process, an appropriate pretreatment for plating is performed to the entire wiring board substrate 1 (surface and through-hole surface of the plating resist film 2 and the wall surface of the through-hole 3). As the pretreatment for plating, the surface was degreased and cleaned, and a plating catalyst was applied. Furthermore, as a polishing process, the surface (plane) of the plating resist film 2 is polished with an abrasive cloth or the like to remove the unnecessary plating catalyst attached to the surface (plane) of the plating resist film 2. Physical polishing is preferable as a polishing method. By performing the polishing process, the plating catalyst is mostly removed from the surface of the plating resist film 2, but left on the wall surface of the through-hole 3 and the through-hole surface of the plating resist film 2. In other words, by performing the plating pretreatment process which includes the polishing process, the pretreatment for plating is applied to the through-hole surface of the plating resist film 2 and the wall surface of the through-hole 3.

Figure 3:
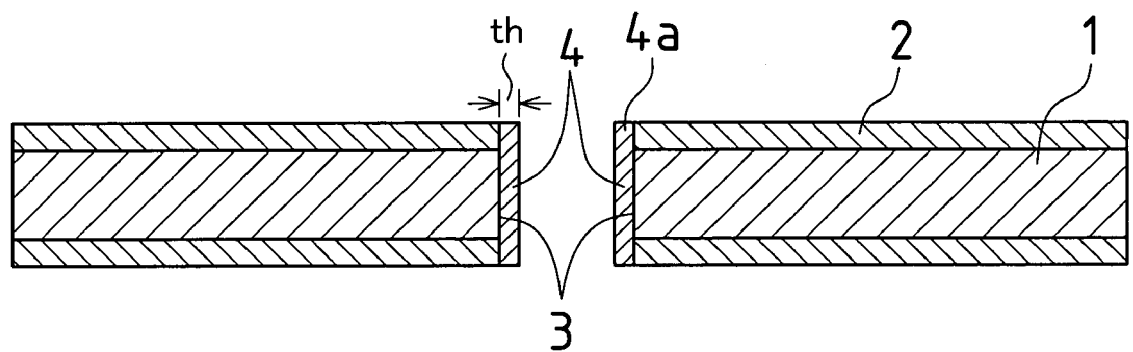
FIG. 3 is a cross-sectional view in a process for explaining a multilayer printed wiring board and a method for producing the same according to Embodiment 1 of the present invention, showing a state in which through-hole conductor is formed on the wall surface of the through-hole.

FIG. 3 shows a state in which a through-hole conductor 4 is formed on the wall surface of the through-hole 3 in a through-hole conductor forming process. When a plating treatment, more specifically electroless plating, is applied to the surface of the wiring board substrate 1 after the plating pretreatment described in FIG. 2, the deposited plating metal grows along the wall surface of the through-hole 3 and the through-hole surface of the plating resist film 2 as a result of plating catalyst reaction, so that the through-hole conductor 4 is formed in the film thickness th (through-hole conductor forming process).

The wiring board substrate 1 (resin plate) may be shaken or pressurized plating fluid may be allowed to flow through the through-hole 3 during the plating treatment in order to promote plating metal depositing on the wall surface of the through-hole 3 and the through-hole surface of the plating resist film 2. Although copper is preferable as a plating metal applied for formation of the through-hole conductor 4 in view of conductivity, ease of processing, and cost, other materials may also be used.

After forming the through-hole conductor 4, a plating resist film stripping process is performed to strip off the plating resist film 2. By performing this process, the through-hole conductor 4 that extends along the wall surface of the through-hole 3 and the through-hole surface of the plating resist film 2 and has the protrusion 4*a* that projects from the surface of the wiring board substrate 1 can be formed. The through-hole conductor 4 can have a larger area around the opening area of the through-hole 3 by being provided with the protrusion 4*a*, and therefore the connecting area of the through-hole conductor 4 to a panel plating layer 5 (see FIG. 4) and a conductor pattern 6 (see FIG. 5) also becomes larger, which secures reliable connections of the through-hole conductor 4 to the panel plating layer 5 (see FIG. 4) and the conductor pattern 6 (see FIG. 5).

In other words, by utilizing the protrusion 4*a*, the through-hole conductor 4 can be reliably attached to the wiring board substrate 1, which makes it possible to improve the mechanical strength of and reduce the conductive resistance of the through-hole conductor 4, and, therefore, the reliability of the multilayer printed wiring board improves.

Figure 4:
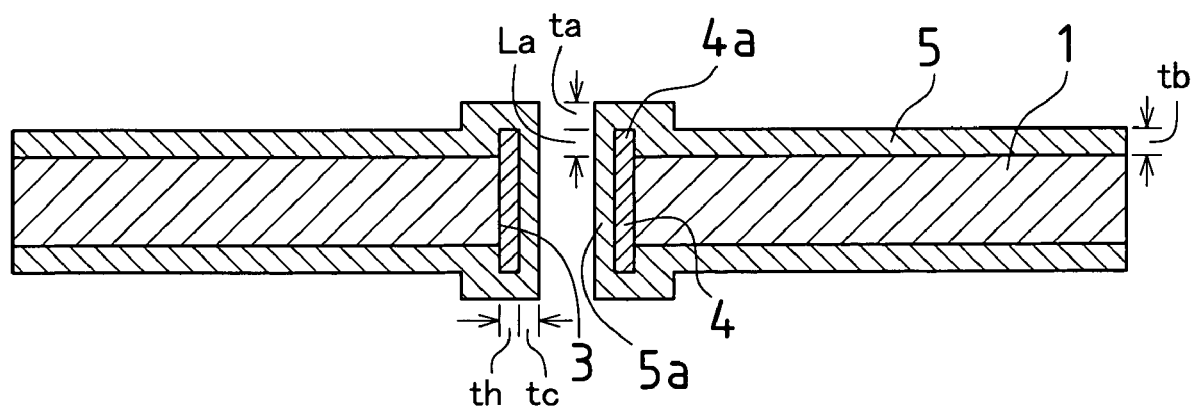
FIG. 4 is a cross-sectional view in a process for explaining a multilayer printed wiring board and a method for producing the same according to Embodiment 1 of the present invention, showing a state in which a panel plating layer (and panel-plated through-hole conductor) is formed on the wiring board substrate.

Subsequent to the plating resist film stripping process, an appropriate plating pretreatment (plating pretreatment process to form the panel plating layer 5) is performed once again to the entire wiring board substrate (surface of the wiring board substrate 1 and surface of the through-hole conductor 4). As the pretreatment for plating, the surface was degreased and cleaned, and a catalyst treatment was applied to attach a plating catalyst FIG. 4 shows a state in which the panel plating layer 5 (and the panel-plated through-hole conductor 5*a*) is formed on the surface of the wiring board substrate in a panel plating layer forming process, following the plating pretreatment process performed to allow formation of the panel plating layer 5. The plating treatment (electroless plating or electrolytic plating) is applied to the wiring board substrate 1 to form the panel plating layer 5 on the entire surface of the wiring board substrate 1 (surface of the through-hole conductor 4 having the protrusion 4*a* and the surface of the wiring board substrate 1). A plating metal used for the panel plating layer 5 may be selected based on compatibility with and adhesive performance to the through-hole conductor 4. Although copper is preferable as a plating metal since copper is generally used for the through-hole conductor 4 and is generally favorable in view of conductivity, ease of processing, and cost, other materials may also be used.

Figure 5:
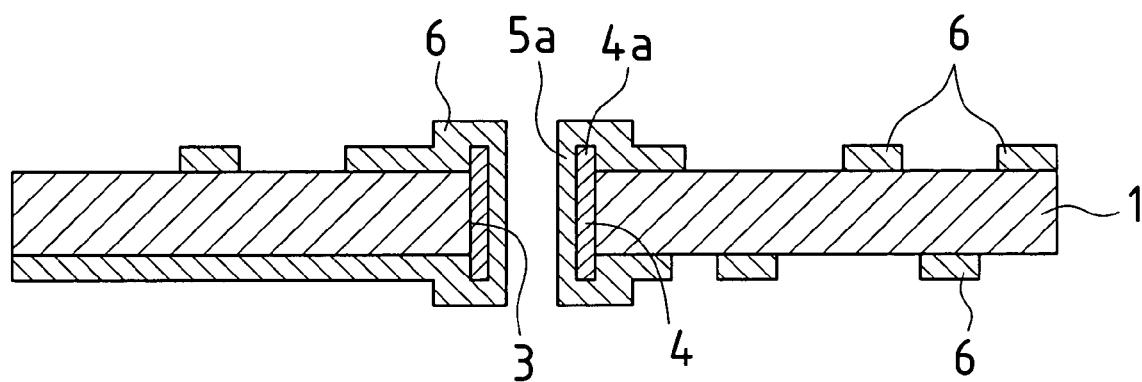
FIG. 5 is a cross-sectional view in a process for explaining a multilayer printed wiring board and a method for producing the same according to Embodiment 1 of the present invention, showing a state in which a conductor pattern is formed.

The film thickness tb of the panel plating layer 5 may be set to a film thickness required to form the conductor pattern 6 (see FIG. 5). In other words, since the film thickness can be minimum necessary, a fine conductor pattern 6 with high patterning precision can be formed by selecting a small film thickness suitable for microsizing. In addition, to improve the adhesiveness of the panel plating layer 5 to the wiring board substrate 1, heat treatment may be performed as appropriate subsequently to the plating treatment.

The panel plating layer forming process makes it possible to coat the surface of the through-hole conductor 4 having the protrusion 4*a* and the surface of the wiring board substrate 1. Since the panel plating layer 5 coats the surface of the through-hole conductor 4 including the protrusion 4*a*, the actual film thickness of the through-hole conductor 4 at the through-hole 3 becomes a sum of the film thickness th of the through-hole conductor 4 and the film thickness tc of the panel-plated through-hole conductor 5*a*. In other words, since the film thickness th of the through-hole conductor 4 becomes practically larger (th+tc), the conductive resistance of the through-hole conductor 4 can be reduced and the reliability of the through-hole conductor 4 can be increased. In addition, since the panel plating layer 5 coats the protrusion 4*a*, the connecting area (contact area) between the through-hole conductor 4 and the panel plating layer 5 becomes larger, enabling to secure contact strength of the through-hole conductor 4 to the through-hole 3.

In case of deficiencies of the through-hole conductor 4, such as uneven plating and deficient plating, they can be compensated with the panel-plated through-hole conductor 5*a*. Because of this, failures originating in the through-hole conductor 4 will be prevented, and the reliability of the through-hole conductor 4 improves.

The conductor thickness in the area where the panel plating layer 5 coats the protrusion 4*a* is a sum of the protrusion length La of the protrusion 4*a* and the film thickness ta of the panel plating layer 5, which is larger than the film thickness tb of the panel plating layer 5 at the surface (plane) of the panel plating layer 5. In other words, the protrusion 4*a* is reliably coated with the panel plating layer 5. The film thickness ta and tb of the panel plating layer 5 are usually in the same level. In addition, although the film thickness tc of the panel-plated through-hole conductor 5*a* is in the same level as the film thickness tb of the panel plating layer 5, it can become somewhat thinner depending on conditions.

Connection between the through-hole conductor 4 and the panel plating layer 5 formed on the surface of the wiring board substrate 1 is established at the conductor that has a larger thickness (sum of the protrusion length La of the protrusion 4*a* and the film thickness ta of the panel plating layer 5) than the film thickness tb of the panel plating layer 5. In other words, contact strength can be improved at the connection point between the through-hole conductor 4 and the panel plating layer 5 by enlarging the connection area (contact area) through adjustment of the protrusion length La of the protrusion 4*a*.

FIG. 5 shows a state in which the conductor pattern 6 is formed by patterning the panel plating layer as appropriate in a patterning process. Since the panel plating layer 5 is formed on both sides of the wiring board substrate 1, a multilayer printed wiring board with double-sided wiring can be achieved by forming the conductor pattern 6 on both of it sides. A highly precise fine conductor pattern 6 is achievable since an etching resist is formed on the surface of the panel plating layer 5 having a specific thickness tb, and then the panel plating layer 5 is patterned so that the conductor pattern 6 that corresponds to specific circuit wiring is formed.

Although the indicated example describes formation of the conductor pattern 6 through patterning after the entire surface is plated with the panel plating layer 5, another method, more specifically direct formation of the conductor pattern 6 through application of patterned plating (formation of the plating layer only to the locations that corresponds to the conductor pattern 6) after an appropriate pretreatment, may also be selected instead of plating of the entire surface. The latter method makes it possible to omit the direct patterning process on the panel plating layer 5.

Following the patterning process, processes such as solder resist forming, symbol printing and shaping are performed to complete a multilayer printed wiring board.

Needless to say, although a double-sided wiring substrate is used as an example of this embodiment for ease of explanation, the exactly same process may be applied to a plurality of multilayer wiring patterns and a through-hole or via hole penetrating a plurality of conductor layers.

Embodiment 2

Figure 6:
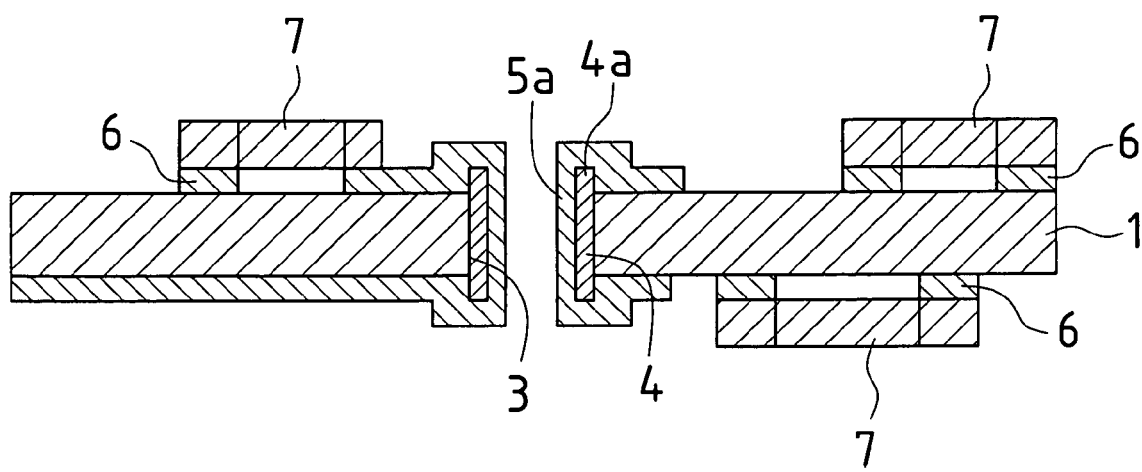
FIG. 6 is a cross-sectional view for explaining an electronic device according to Embodiment 2 of the present invention, showing a state in which electronic components are mounted on a multilayer printed wiring board.

FIG. 6 is a cross-sectional view for explaining an electronic device according to Embodiment 2 of the present invention. The same numeric references are used for the same components as Embodiment 1 and detailed explanation is omitted when deemed appropriate.

FIG. 6 indicates a conceptual illustration of an electronic device having electronic components 7 mounted (soldered) as appropriate thereon on locations that correspond to the conductor pattern 6 (multilayer printed wiring board formed according to Embodiment 1 as shown in FIG. 5) which is formed to correspond to specific circuit wiring for construction of the electronic device. Examples of the electronic components 7 include chip resistors and chip capacitors. It is, of course, also possible to mount a chip integrated circuit.

Since an electronic device is produced by mounting the electronic components 7 on a more reliable multilayer printed wiring board having the through-hole conductor 4 (and the panel-plated through-hole conductor 5a) that has a large mechanical strength and low conductive resistance, the reliability of the electronic device also becomes high.

Embodiment 3

Figure 7:
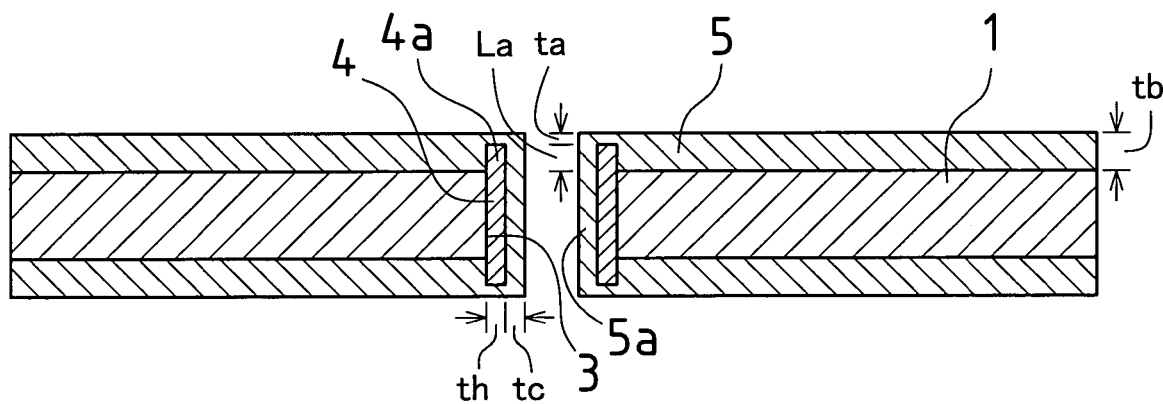
FIG. 7 is a cross-sectional view for explaining a multilayer printed wiring board and a method for producing the same according to Embodiment 3 of the present invention.

FIG. 7 is a cross-sectional view for explaining a multilayer printed wiring board and a method for producing the same according to Embodiment 3 of the present invention. The same numeric references are used for the same components as Embodiments 1 and 2 and detailed explanation is omitted when deemed appropriate.

A multilayer printed wiring board in this embodiment is produced by changing the plating conditions used to form the panel plating layer 5 (see FIG. 4) in a panel plating layer forming process according to Embodiment 1 so that the film thickness tb of the panel plating layer 5 becomes in the same level as the sum of the protrusion length La of the protrusion 4a of the through-hole conductor 4 and the film thickness ta of the panel plating layer 5. The plating conditions include composition of a panel plating bath, plating method, metal selection and plating film thickness.

Film thickness tb of the panel plating layer 5 may be set to the film thickness necessary to form the conductor pattern 6. In other words, since the film thickness can be minimum necessary, a highly precise conductor pattern 6 can be formed. In addition, to improve the contact performance of the panel plating layer 5 to the wiring board substrate 1, heat treatment may be performed as appropriate subsequently to the plating treatment.

The panel plating layer forming process makes it possible to coat the surface of the through-hole conductor 4 having the protrusion 4a and the surface of the wiring board substrate 1. Since the panel plating layer 5 coats the surface of the through-hole conductor including the protrusion 4a, the actual film thickness of the through-hole conductor 4 at the through-hole 3 becomes a sum of the film thickness th of the through-hole conductor 4 and the film thickness tc of the panel-plated through-hole conductor 5a. In other words, since the film thickness th of the through-hole conductor 4 becomes practically larger (th+tc), the conductive resistance of the through-hole conductor 4 can be reduced and the reliability of the through-hole conductor 4 can be increased. In addition, since the panel plating layer 5 coats the protrusion 4a, the connecting area (contact area) between the through-hole conductor 4 and the panel plating layer 5 becomes larger, enabling to secure the contact strength of the through-hole conductor 4 to the through-hole 3.

In case of deficiencies of the through-hole conductor 4, such as uneven plating and deficient plating, they can be compensated with the panel-plated through-hole conductor 5a. Because of this, failures originating in the through-hole conductor 4 will be prevented, and the reliability of the through-hole conductor 4 improves.

In addition, since the film thickness tb of the panel plating layer 5 is set to be in the same level as a sum of the protrusion length La of the protrusion 4a of the through-hole conductor 4 and the film thickness ta of the panel plating layer 5, the panel plating layer 5 having a more favorable evenness can be achieved.

Embodiment 4

Figure 8:
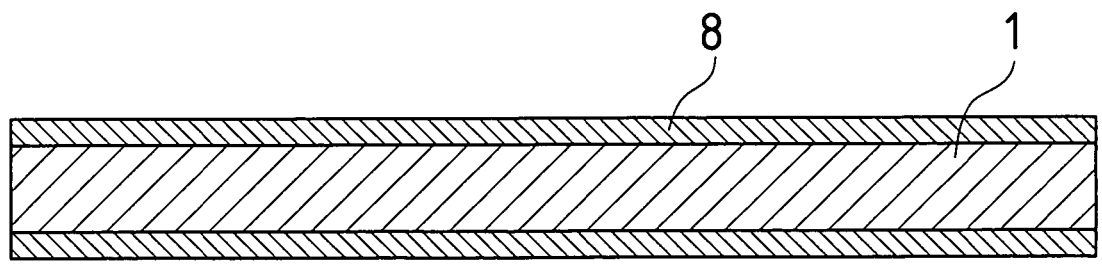
FIG. 8 is a cross-sectional view for explaining a multilayer printed wiring board and a method for producing the same according to Embodiment 4 of the present invention, showing a laminate having metal coating on both its sides as the base material of the multilayer printed wiring board.
Figure 9:
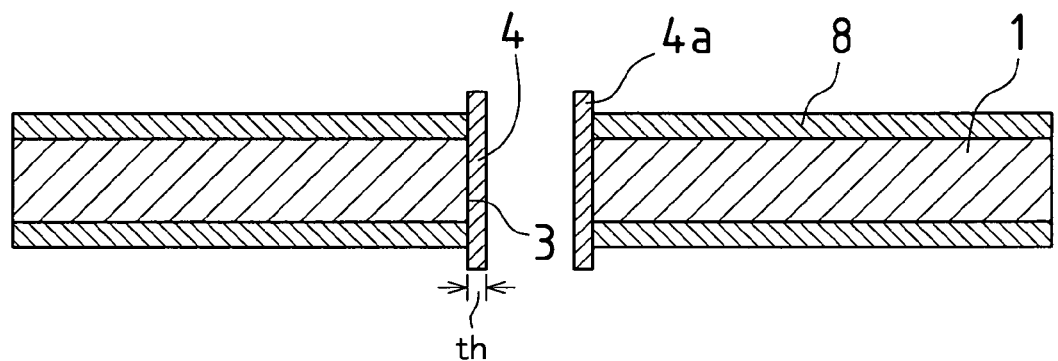
FIG. 9 is a cross-sectional view for explaining a multilayer printed wiring board and a method for producing the same according to Embodiment 4 of the present invention, showing a state of the multilayer printed wiring board that has been subjected to a plating resist film forming process, a through-hole forming process, a plating pretreatment process, a through-hole conductor forming process, and a plating resist film stripping process.
Figure 10:
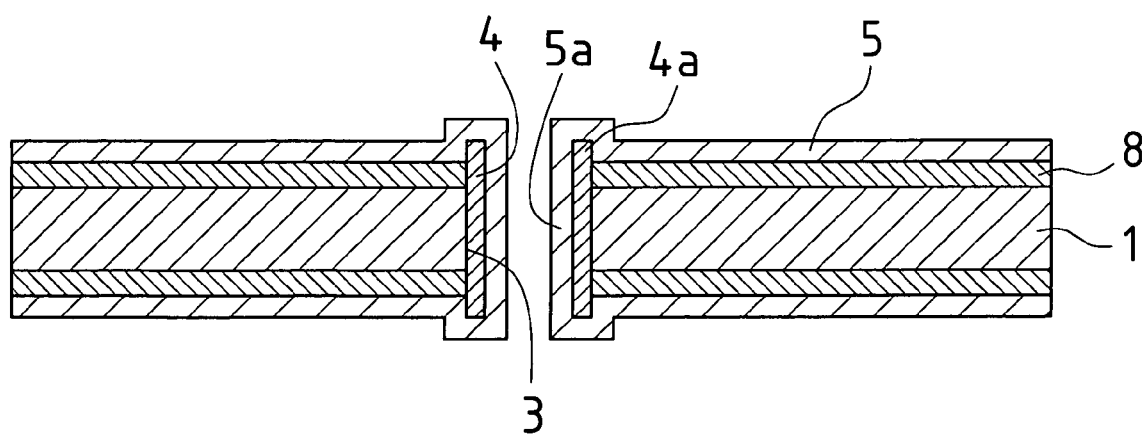
FIG. 10 is a cross-sectional view for explaining a multilayer printed wiring board and a method for producing the same according to Embodiment 4 of the present invention, showing a state in which a panel plating layer (and panel-plated through-hole conductor) is formed on the wiring board substrate (metal foil).

FIGS. 8 to 10 are cross-sectional views for explaining a multilayer printed wiring board according to Embodiment 4 of the present invention and a method for producing the same. The same numeric references are used for the same components as Embodiments 1 to 3 and detailed explanation is omitted when deemed appropriate. The process of this embodiment is basically the same as that of Embodiment 1 except that a base material of this embodiment is a laminate having metal coating on both its sides.

FIG. 8 shows a laminate having metal coating on both its sides serving as the base material for a multilayer printed wiring board according to the present invention. The laminate having metal coating on both its sides includes a wiring board substrate 1 and a metal foil 8 attached to both the sides of the wiring board substrate 1 with adhesive. To secure physical strength, a material of the wiring board substrate 1 is preferably resin such as epoxy resin plate, polyester resin and polyimide resin or a fiber-reinforced resin, which is reinforced with a fiber such as fiber glass, aramid fiber and paper. Although a copper foil is often used for the metal foil 8, other materials may also be used. In this embodiment, a copper foil was used for the metal foil 8, and a laminate having copper coating on both its sides that is generally available in the market was used.

FIG. 9 shows a state of a multilayer printed wiring board according to Embodiment 1 that has been subjected to the plating resist film forming process, through-hole forming process, plating pretreatment process, through-hole conductor forming process, and plating resist film stripping process.

In other words, the through-hole 3 that penetrates the wiring board substrate 1 and the metal foil 8 is formed, and the through-hole conductor 4 having the protrusion 4a that projects from the metal foil 8 is formed along the wall surface of the metal foil 8 layered on the wall surface of the through-hole 3 and the surface of the wiring board substrate. By selecting a laminate having metal coating on both its sides as the base material, not only electroless plating but also electrolyte plating may be used for plating treatment in the through-hole conductor forming process, and thus a sufficient film thickness th of the through-hole conductor 4 can be achieved in a short time.

FIG. 10 shows a state in which, subsequent to FIG. 9 and the plating pretreatment process (pretreatment process prior to plating to form the panel plating layer 5), the panel plating layer 5 (and the panel-plated through-hole conductor 5a) is formed on the surface of the wiring board substrate 1 (metal foil 8) through the panel plating layer forming process.

Like Embodiment 1, this embodiment also makes it possible to enlarge the area of the through-hole conductor 4 around the opening of the through-hole 3, thereby achieving a reliable connection of the through-hole conductor 4 to the panel plating layer 5 and the conductor pattern 6 which are formed on the wiring board substrate 1 (metal foil 8).

In other words, since the through-hole conductor 4 can be reliably attached to the wiring board substrate 1 utilizing the protrusion 4a, the mechanical strength of the through-hole conductor 4 improves and the conductive resistance can be reduced, thereby improving the reliability of the multilayer printed wiring board.

Subsequent to FIG. 10, the conductor pattern 6 is formed in a patterning process, followed by processes such as solder resist forming, symbol printing and shaping to complete the multilayer print wiring board.

Although a laminate having metal coating on both its sides was used as the base material for this embodiment, it is needless to say that a construction similar to Embodiment 1 and this embodiment can be achieved with an inner layer laminate, which has an inner conductor layer in the inner layer of the wiring board substrate 1.

Embodiment 5

Figure 11:
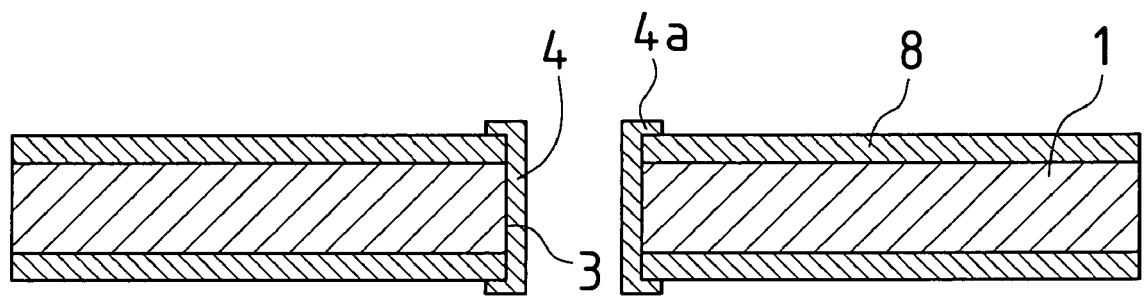
FIG. 11 is a cross-sectional view for explaining a multilayer printed wiring board and a method for producing the same according to Embodiment 5 of the present invention, showing a state in which the protrusion portion is pressed against the wiring board substrate (metal foil).
Figure 12:
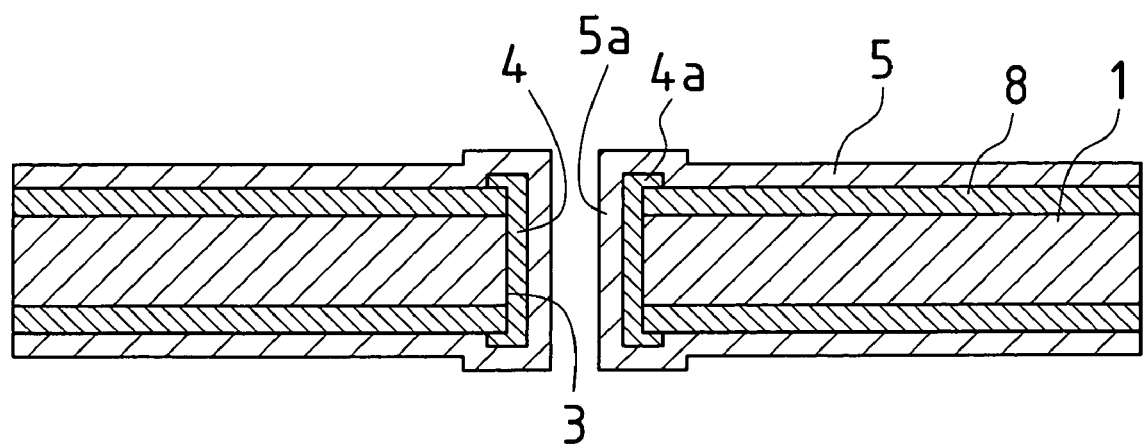
FIG. 12 is a cross-sectional view for explaining a multilayer printed wiring board and a method for producing the same according to Embodiment 5 of the present invention, showing a state in which a panel plating layer (and panel-plated through-hole conductor) is formed after the protrusion pressing process.
Figure 13:
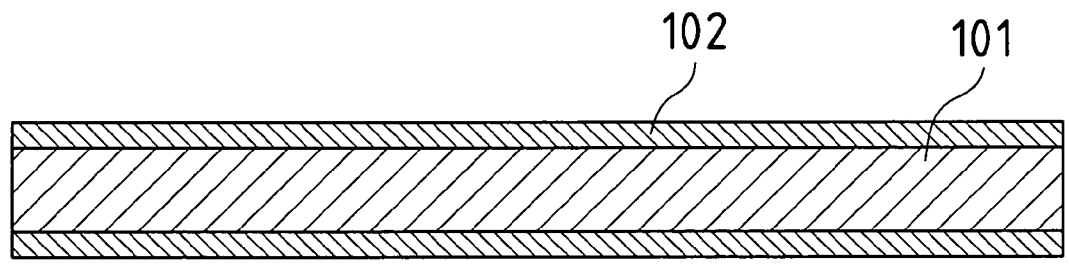
FIG. 13 is a cross-sectional view in a process for explaining a multilayer printed wiring board and a method for producing the same according to Conventional example 1, showing a base material of the multiple printed wiring board.
Figure 14:
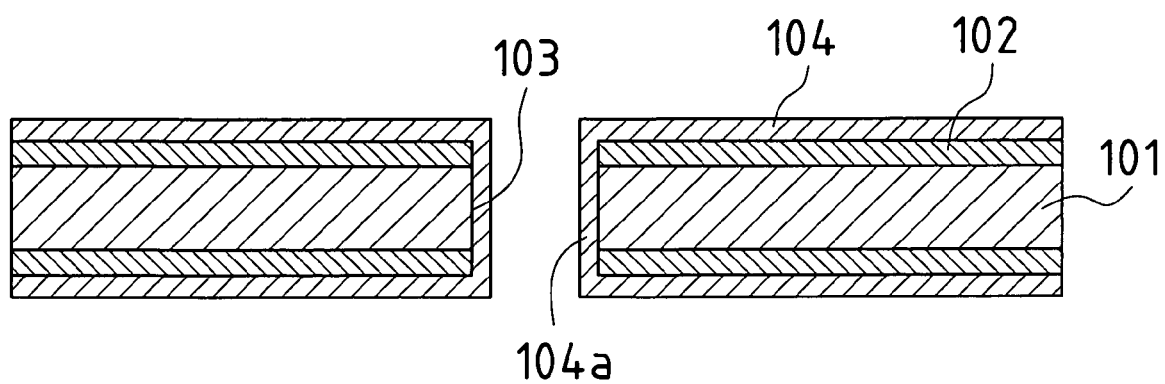
FIG. 14 is a cross-sectional view in a process for explaining a multilayer printed wiring board and a method for producing the same according to Conventional example 1, showing a state in which panel plating has been performed to the entire surface of a laminate having copper coating on both its sides.

FIGS. 11 and 12 are cross-sectional views which describe a multilayer printed wiring board according to Embodiment 5 of the present invention and a method for producing the same. The same numeric references are used for the same components as Embodiments 1 to 4 and detailed explanation is omitted when deemed appropriate.

FIG. 11 shows a state in which the protrusion 4a of the through-hole conductor 4 which is formed in FIG. 9 according to Embodiment 4 is pressed against the wiring board substrate 1 (metal foil 8). In other words, the protrusions 4a are mechanically bent and pressed against (attached to) the wiring board substrate 1 (metal foil 8) (protrusion portion pressing process). Press work using a roller, plate, and others is appropriate as a method for bending.

FIG. 12 shows a state in which a panel plating layer 5 (and the panel-plated through-hole conductor 5a) is formed in a panel plating layer forming process after the protrusion portion pressing process shown in FIG. 11.

Like Embodiments 1 and 4, this embodiments also makes it possible to improve the connectivity between the through-hole conductor 4 and the panel plating layer 5 (metal foil 8). In addition, since the protrusion 4a is pressed against the wiring board substrate 1 (metal foil 8), handling in subsequent processes becomes stable.

Although this embodiment used an example where the protrusion 4a formed according Embodiment 4 is bent, it is needless to say that the same can be applied likewise to the protrusion 4a formed under Embodiment 1.

The present invention can be embodied and practiced in other different forms without departing from the spirit and essential characteristics thereof. Therefore, the above-described embodiments are considered in all respects as illustrative and not restrictive. The scope of the invention is indicated by the appended claims rather than by the foregoing description. All variations and modifications falling within the equivalency range of the appended claims are intended to be embraced therein.

What is claimed is:

1. A method for producing a multilayer printed wiring board having a through-hole that penetrates a wiring board substrate, comprising:
   a plating resist film forming step of forming a plating resist film on a surface of the wiring board substrate,
   a through-hole forming step of forming the through-hole that penetrates the plating resist film and the wiring board substrate,
   a plating pretreatment step of performing a pretreatment for plating on a through-hole surface of the plating resist film and a wall surface of the through-hole,
   a through-hole conductor forming step of fonning a through-hole conductor on the through-hole surface of the plating resist film and the wall surface of the through-hole by a plating treatment,
   a plating resist film stripping step of stripping off the plating resist film, and
   a protrusion portion pressing step of pressing a protrusion portion of the through-hole conductor against the wiring board substrate.

2. The method for producing a multilayer printed wiring board according to claim 1, wherein the plating pretreatment step comprises a polishing step of polishing the surface of the plating resist film after the plating resist film and the through-hole are subjected to the plating pretreatment.

3. The method for producing a multilayer printed wiring board according to claim 1, wherein the wiring board substrate is a resin plate.

4. The method for producing a multilayer printed wiring board according to claim 3, wherein the resin plate is a fiber-reinforced resin plate, resin plate containing adhesive, or resin plate processed with a plating catalyst.

5. The method for producing a multilayer printed wiring board according to claim 1, wherein the wiring board substrate is a two-sided metal coated laminate having a metal foil attached to both its sides.

6. The method for producing a multilayer printed wiring board according to claim 1, wherein the wiring board substrate is an internal layer-containing laminate including an internal conductor layer.

7. The method for producing a multilayer printed wiring board according to claim 1, comprising a panel plating layer forming step of forming a panel plating layer for coating the surface of the through-hole conductor and the wiring board substrate on the wiring board substrate by a plating treatment after the plating resist film stripping step.

8. The method for producing a multilayer printed wiring board according to claim 7, wherein the thickness of the conductor in the area where the protrusion portion is coated with the panel plating layer is larger than the thickness of the panel plating layer on the surface of the wiring board substrate.

9. The method for producing a multilayer printed wiring board according to claim 7, comprising a patterning step of patterning the panel plating layer so as to form a conductor pattern after the panel plating layer forming step.

* * * * *